United States Patent
Suehiro et al.

(10) Patent No.: US 7,470,926 B2
(45) Date of Patent: Dec. 30, 2008

(54) SOLID-STATE OPTICAL DEVICE

(75) Inventors: Yoshinobu Suehiro, Aichi-ken (JP);
Seiji Yamaguchi, Aichi-ken (JP);
Naruhito Sawanobori, Saitama-ken (JP);
Masaaki Ohtsuka, Saitama-ken (JP);
Hiroki Watanabe, Saitama-ken (JP); Kazuya Aida, Saitama-ken (JP)

(73) Assignees: Toyoda Gosei Co., Ltd, Nishikasugai-Gun, Aichi-ken (JP); Sumita Optical Glass, Inc., Saitama-shi, Saitama-ken (JP)

( * ) Notice: Subject to any disclaimer, the term of this patent is extended or adjusted under 35 U.S.C. 154(b) by 426 days.

(21) Appl. No.: 11/220,777

(22) Filed: Sep. 8, 2005

(65) Prior Publication Data
US 2006/0049421 A1    Mar. 9, 2006

(30) Foreign Application Priority Data

| Sep. 9, 2004 | (JP) | ............................. 2004-262908 |
| Sep. 9, 2004 | (JP) | ............................. 2004-263098 |
| May 12, 2005 | (JP) | ............................. 2005-140284 |

(51) Int. Cl.
*H01L 29/06* (2006.01)
*H01L 29/12* (2006.01)

(52) U.S. Cl. .......................... 257/10; 257/612; 257/99; 313/512; 362/34; 362/84; 362/245

(58) Field of Classification Search ................... 257/99, 257/612, 10; 313/512; 362/34, 84, 245
See application file for complete search history.

(56) References Cited

U.S. PATENT DOCUMENTS

| 4,940,677 A | 7/1990 | Beall et al. |
| 5,022,921 A | 6/1991 | Aitken |
| 5,122,484 A | 6/1992 | Beall et al. |
| 6,163,106 A | 12/2000 | Sugawara et al. |
| 6,756,731 B1 | 6/2004 | Sano |
| 7,382,033 B2 | 6/2008 | Roth et al. |
| 2001/0026011 A1* | 10/2001 | Roberts et al. ............... 257/678 |
| 2004/0004437 A1* | 1/2004 | Shimizu et al. ............. 313/512 |
| 2004/0087428 A1 | 5/2004 | Otsuka et al. |

(Continued)

FOREIGN PATENT DOCUMENTS

CN    1067032 A    12/1992

(Continued)

OTHER PUBLICATIONS

Chinese Office Action Dated Jun. 22, 2007, with English-language translation.

(Continued)

*Primary Examiner*—Zandra Smith
*Assistant Examiner*—Telly D Green
(74) *Attorney, Agent, or Firm*—McGinn IP Law Group, PLLC

(57) ABSTRACT

A solid-state optical device having: a solid-state element; a power supplying/retrieving portion that supplies or retrieves electric power to/from the solid-state element; and a glass sealing material that seals the solid-state element. The glass sealing material is made of a $P_2O_5$—ZnO-based low-melting glass that has 45 to 50 wt % of $P_2O_5$ and 15 to 35 wt % of ZnO.

8 Claims, 8 Drawing Sheets

U.S. PATENT DOCUMENTS

| | | | |
|---|---|---|---|
| 2004/0169466 A1* | 9/2004 | Suehiro et al. | 313/512 |
| 2004/0222435 A1* | 11/2004 | Shimizu et al. | 257/100 |
| 2004/0223315 A1* | 11/2004 | Suehiro et al. | 362/84 |
| 2004/0257797 A1* | 12/2004 | Suehiro et al. | 362/34 |
| 2005/0161771 A1* | 7/2005 | Suehiro et al. | 257/612 |
| 2006/0163683 A1 | 7/2006 | Roth et al. | |

FOREIGN PATENT DOCUMENTS

| | | |
|---|---|---|
| DE | 34 46 919 A1 | 7/1985 |
| DE | 100 27 199 A1 | 1/2001 |
| JP | 48-29383 | 4/1973 |
| JP | 8-102553 | 4/1996 |
| JP | 11-177129 | 7/1999 |
| JP | 2000-239801 | 9/2000 |
| JP | 2001-261369 | 9/2001 |
| JP | 2002-094123 | 3/2002 |
| JP | 2003-008071 | 1/2003 |
| JP | 2004-095580 | 3/2004 |
| WO | WO 2004/056939 | 7/2004 |

OTHER PUBLICATIONS

Japanese Office Action dated Oct. 7, 2008 with Partial English Translation.

* cited by examiner

US 7,470,926 B2

SOLID-STATE OPTICAL DEVICE

The present application is based on Japanese patent application Nos. 2004-263098, 2004-262908 and 2005-140284, the entire contents of which are incorporated herein by reference.

BACKGROUND OF THE INVENTION

1. Field of the Invention

The invention relates to a solid-state optical device and, particularly, to a solid-state optical device with a sealing material of low-melting glass. Herein, the solid-state optical device includes various optical devices that are composed of a solid-state element (or a semiconductor element) such as a light emitting element (or LED element), a light receiving element and a solar cell element.

2. Description of the Related Art

A solid-state optical device is conventionally known in which a solid-state component such as an LED element is sealed with a transparent resin material such as epoxy rein. It is known that transparent resins deteriorate due to irradiation of light. Especially, when a group III nitride-based compound semiconductor LED element to emit a short-wavelength light is used, the transparent resin around the LED element will turn yellow due to a high-energy light emitted from the LED element and heat generated from the LED element. Therefore, its light extraction efficiency may lower significantly.

To prevent the deterioration of the sealing material, some solid-state optical devices are proposed (for example, JP-A-8-102553 and JP-A-11-177129).

JP-A-8-102553 discloses a light emitting device that an LED element, bonding wires and upper part of leads are sealed with a transparent sealing material of low-melting glass. The low-melting glass is, for example, glass to which selenium, thallium, arsenic, sulfur etc. are added to have a melting point of 130 to 350° C. In this case, it is preferable to use low-melting glass with a melting point of 200° C. or less, more preferably 150° C. or less.

The light emitting device of JP-A-8-102553 can solve the problem that the transparent resin material optically deteriorates with time due to the irradiation of UV light, by using the transparent sealing material of the low-melting glass.

On the other hand, JP-A-11-177129 discloses a light emitting device that an LED element is sealed with a sealing material of low-melting glass with a refractive index of about 2 which is close to 2.3, the refractive index of a GaN-based LED element.

The light emitting device of JP-A-11-177129 has a function that light totally reflected at the interface between the LED element and the low-melting glass is reduced by sealing the LED element with the low-melting glass with the refractive index close to that of the GaN-based LED element, and the amount of light to get into the low-melting glass while being emitted from the LED element is increased. As a result, the light extraction efficiency thereof can be increased as compared to the conventional LED element sealed with epoxy resin.

However, the abovementioned solid-state optical devices cannot have sufficient sealing properties even when the sealing material of low-melting glass is used since the conventional low-melting glass has a high viscosity in a working sealing temperature range.

SUMMARY OF THE INVENTION

It is an object of the invention to provide a solid-state optical device that can have sufficient sealing properties while using a sealing material of low-melting glass.

It is a further object of the invention to provide a solid-state optical device that can have excellent moisture resistance, and can prevent the opacity of glass material in sealing and the white turbidity of glass material in evaluation of the characteristics.

It is a further object of the invention to provide a solid-state optical device that can be applied to the tight mounting of optical elements and to a large-size optical element.

(1) According to one aspect of the invention, a solid-state optical device comprises:
a solid-state element;
a power supplying/retrieving portion that supplies or retrieves electric power to/from the solid-state element; and
a glass sealing material that seals the solid-state element,
wherein the glass sealing material comprises a $P_2O_5$—ZnO-based low-melting glass that comprises 45 to 50 wt % of $P_2O_5$ and 15 to 35 wt % of ZnO.

(2) According to another aspect of the invention, a solid-state optical device comprises:
a solid-state element;
a power supplying/retrieving portion that supplies or retrieves electric power to/from the solid-state element; and
a glass sealing material that seals the solid-state element,
wherein the glass sealing material comprises a $P_2O_5$—F-based low-melting glass that comprises 6 to 50 wt % of $P_2O_5$ and 1 to 45 wt % of ZnO in weight % based on oxide.

(3) According to another aspect of the invention, a solid-state optical device comprises:
a solid-state element;
a power supplying/retrieving portion on which the solid-state element is mounted, the power supplying/retrieving portion supplying or retrieving electric power to/from the solid-state element; and
a glass sealing material that seals the solid-state element,
wherein the glass sealing material has a thermal expansion coefficient equivalent to that of the power supplying/retrieving portion, and
the glass sealing material comprises a $P_2O_5$—$Al_2O_3$—ZnO-based low-melting glass that comprises 55 to 62 wt % of $P_2O_5$, 5 to 12 wt % of $Al_2O_3$ and 20 to 40 wt % of ZnO in weight %.

(4) According to another aspect of the invention, a solid-state optical device comprises:
a solid-state element;
a power supplying/retrieving portion on which the solid-state element is mounted, the power supplying/retrieving portion supplying or retrieving electric power to/from the solid-state element; and
a glass sealing material that seals the solid-state element,
wherein the glass sealing material has a thermal expansion coefficient equivalent to that of the power supplying/retrieving portion, and
the glass sealing material comprises a $B_2O_3$—$SiO_2$—$Na_2O$—ZnO—$Nb_2O_5$-based low-melting glass that comprises 19 to 30 wt % of $B_2O_3$, 0.5 to 15 wt % of $SiO_2$, 1.5 to 8 wt % of $Na_2O$, 44 to 60 wt % of ZnO and 9 to 19 wt % of $Nb_2O_5$ in weight %.

(5) According to another aspect of the invention, a solid-state optical device comprises:
   a solid-state element;
   a power supplying/retrieving portion on which the solid-state element is mounted, the power supplying/retrieving portion supplying or retrieving electric power to/from the solid-state element; and
   a glass sealing material that seals the solid-state element,
   wherein the glass sealing material has a thermal expansion coefficient equivalent to that of the power supplying/retrieving portion, and
   the glass sealing material comprises a $B_2O_3$—$SiO_2$—$ZnO$—$Bi_2O_3$-based low-melting glass that comprises 1 to 10 wt % of $SiO_2$, 15 to 30 wt % of $B_2O_3$, 25 to 60 wt % of ZnO and 10 to 50 wt % of $Bi_2O_3$ in weight %.

(6) According to another aspect of the invention, a solid-state optical device comprises:
   a solid-state element;
   a power supplying/retrieving portion on which the solid-state element is mounted, the power supplying/retrieving portion supplying or retrieving electric power to/from the solid-state element; and
   a glass sealing material that seals the solid-state element,
   wherein the glass sealing material has a thermal expansion coefficient equivalent to that of the power supplying/retrieving portion, and
   the glass sealing material comprises a $B_2O_3$—$SiO_2$—PbO-based low-melting glass that comprises 20 wt % to 50 wt % of $B_2O_3$ and 30 wt % to 70 wt % of PbO in weight %.

(7) According to another aspect of the invention, a solid-state optical device comprises:
   a solid-state element;
   a power supplying/retrieving portion on which the solid-state element is mounted, the power supplying/retrieving portion supplying or retrieving electric power to/from the solid-state element; and
   a glass sealing material that seals the solid-state element,
   wherein the glass sealing material has a thermal expansion coefficient equivalent to that of the solid-state element and the power supplying/retrieving portion.

ADVANTAGES OF THE INVENTION

A solid-state optical device, especially a light emitting device, of the invention can have sufficient sealing properties while using a sealing material of low-melting glass.

Further, a solid-state optical device of the invention can have excellent moisture resistance, and can prevent the opacity of glass material in sealing and the white turbidity of glass material in evaluation of the characteristics.

Further, a solid-state optical device of the invention can be applied to the tight mounting of optical elements and to a large-size optical element since the entire device is constructed by a material with a low thermal expansion coefficient.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

First Embodiment

Figure 1A:
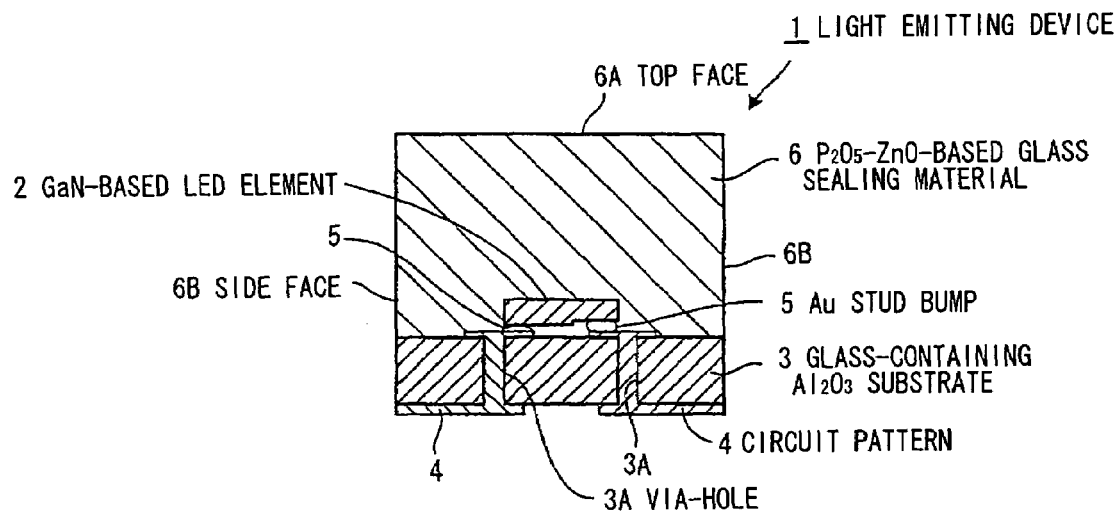
FIG. 1A is a cross sectional view showing a light emitting device as a solid-state optical device in a first preferred embodiment of the invention.
Figure 1B:
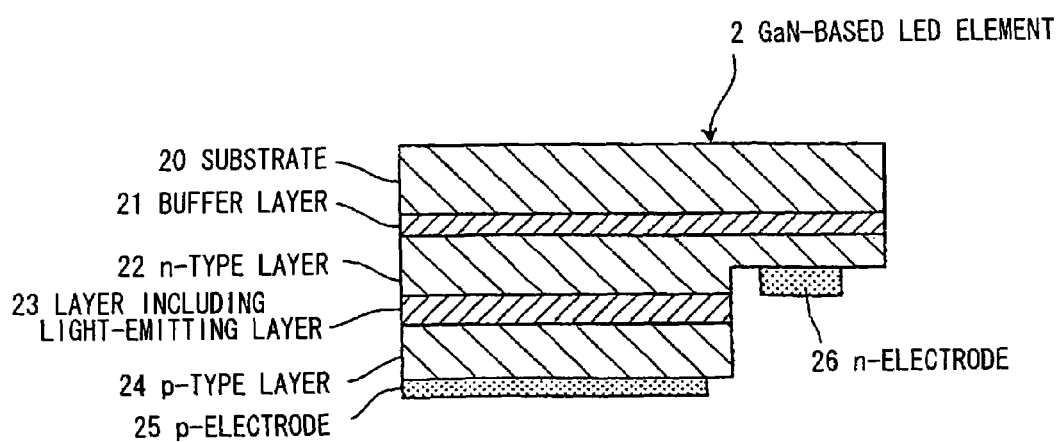
FIG. 1B is a side view showing a GaN-based LED element in FIG. 1A.

FIG. 1A is a cross sectional view showing a light emitting device as a solid-state optical device in the first preferred embodiment of the invention. FIG. 1B is a side view showing a GaN-based LED element in FIG. 1A.

(Construction of the Light Emitting Device 1)

The light emitting device 1 is, as shown in FIG. LA, composed of: a flip-chip type GaN-based LED element 2; a glass-containing $Al_2O_3$ substrate 3, as an inorganic material substrate, on which the GaN-based LED element 2 is mounted; a circuit pattern 4 which is made of tungsten (W)-nickel (Ni)-gold (Au) and is formed on the glass-containing $Al_2O_3$ substrate 3; Au stud bumps 5 which electrically connects between the GaN-based LED element 2 and the circuit pattern 4; and a glass sealing material 6 which is a $P_2O_5$—ZnO—$Li_2O$-based transparent inorganic sealing material and is bonded to the glass-containing $Al_2O_3$ substrate 3 while sealing the GaN-based LED element 2. In this embodiment, the glass-containing $Al_2O_3$ substrate 3 and the circuit pattern 4 define a power supplying/retrieving portion.

The GaN-based LED element 2 is, as shown in FIG. 1B, composed of: a substrate 20 of sapphire ($Al_2O_3$); a buffer layer 21; an n-type layer 22; a layer 23 including a light-emitting layer; and a p-type layer 24, where the buffer layer 21 to the p-type layer 24 are sequentially grown on the substrate 20. Further, the GaN-based LED element 2 is composed of a p-electrode 25 formed on the p-type layer 24, and an n-electrode 26 formed on a part of the n-type layer 22 which is exposed by etching the p-type layer 24 through the n-type layer 22. The GaN-based LED element 2 is epitaxially grown at a temperature of 700° C. or more and has an allowable temperature limit of 600° C. or more, and it is stable to a process temperature in sealing with the low-melting glass described later.

The p-electrode 25 functions as a light reflecting layer to reflect light emitted from the layer 23 including the light-emitting layer toward the substrate 20. In this embodiment, the p-electrode 25 has dimensions of 0.34 mm wide×0.34 mm deep×0.09 mm thick.

The glass-containing $Al_2O_3$ substrate 3 has a thermal expansion coefficient of $12.3×10^{-6}$/° C. and is provided with plural via-holes 3A. The via-holes 3A serves to electrically connect between the circuit patterns 4 metallized on the top and bottom surface of the substrate 3. The circuit pattern 4 is composed of a first conductive pattern formed on a surface that the GaN-based LED element 2 is mounted, a second conductive pattern formed on the opposite surface, and a third conductive pattern, which is of tungsten (W), electrically connects between the first and second conductive patterns.

The glass sealing material 6 is made of a $P_2O_5$—ZnO—$Li_2O$-based low-melting glass, which has a glass transition temperature Tg of 380° C., a yielding point At of 407° C., a thermal expansion coefficient of $12.2×10^{-6}$/° C., a refractive index of 1.60 and an internal transmittance of 99% (470 nm). It is bonded to the glass-containing $Al_2O_3$ substrate 3 by hot pressing with a mold and is formed rectangular with a top face 6A and a side face 6B made by cutting with a dicer.

The low-melting glass is typically processed with a viscosity several orders of magnitude higher than a high-viscosity level in resin. In the case of glass, in the range of practical sealing temperature, the viscosity thereof cannot be reduced to that of typical resin-sealing level even when it is heated to a temperature exceeding tens of ° C. over the yielding point. Nevertheless, in order to have the viscosity of typical resin-sealing level, it is needed to heat it to a temperature exceeding the crystal growth temperature of LED element. At such a high temperature, the glass will be adhered to the mold and, therefore, the sealing and molding therewith becomes difficult. Because of this, it is preferably processed at a viscosity of $10^4$ poises or more.

(Process of Making the Light Emitting Device 1)

A process of making the light emitting device 1 will be described below.

At first, the glass-containing $Al_2O_3$ substrate 3 with the via-hole 3A is provided, and tungsten paste is screen-printed on the surface of the glass-containing $Al_2O_3$ substrate 3 according to the circuit pattern 4.

Then, the glass-containing $Al_2O_3$ substrate 3 with the tungsten paste printed thereon is thermally treated at 1000° C. or so to burn tungsten into the substrate 3, and nickel and gold are sequentially plated on tungsten to form the circuit pattern 4.

Then, the GaN-based LED element 2 is electrically bonded through the Au stud bumps 5 to the circuit pattern 4 (on the surface side) of the glass-containing $Al_2O_3$ substrate 3.

Then, plate-like $P_2O_5$—ZnO—$Li_2O$-based low-melting glass is placed in parallel with the glass-containing $Al_2O_3$ substrate 3 with the GaN-based LED element 2 mounted thereon, and then hot-pressed in a nitrogen atmosphere. In the process, the viscosity of the low-melting glass is $10^8$ to $10^9$ poises and the low-melting glass is bonded to the glass-containing $Al_2O_3$ substrate 3 through oxides included therein.

Then, the glass-containing $Al_2O_3$ substrate 3 integrated with the low-melting glass is placed on the dicer and then is diced separately into the light emitting device 1.

Meanwhile, the GaN-based LED element 2 can be processed by scribing. In this case, since the scribed GaN-based LED element 2 may have a sharp unevenness on the side face corresponding to the cut portion, it is desired that the side face of the GaN-based LED element 2 is coated with a device coat material. The device coat material can be, e.g., a $SiO_2$-based coat material with light transmitting property. The device coat material can prevent the occurrence of crack or void.

(Composition of the Glass Sealing Material 6)

The low-melting glass applicable in this embodiment will be detailed below.

Samples 1 to 3 for the glass sealing material 6 are prepared by changing the composition of $P_2O_5$, $Li_2O$, MgO, CaO, SrO, BaO, ZnO, $ZrO_2$, RO, $Nb_2O_5$ and $Al_2O_3$.

For comparison, a comparative sample with the same oxides as samples 1 to 3 is prepared. Table 1 described below shows the composition and properties of samples 1 to 3 and the comparative sample. In Table 1, nF-nC means a primary dispersion.

TABLE 1

| Composition (wt %) | Sample 1 | Sample 2 | Sample 3 | Comparative sample |
|---|---|---|---|---|
| MgO | — | 3 | — | — |
| $P_2O_5$ | 50 | 45 | 48 | 55 |
| $Al_2O_3$ | 3 | 2 | 1.5 | 2.5 |
| $Li_2O$ | 5 | 5 | 4.5 | 5 |
| CaO | 2 | 3 | 5.5 | 2 |
| SrO | 10 | — | — | — |
| BaO | — | 15 | 14.5 | 6 |
| ZnO | 30 | 25 | 24 | 27 |
| $Nb_2O_5$ | — | 1 | 1 | 1.5 |
| $ZrO_2$ | — | 1 | 1 | 1 |
| Tg (° C.) | 380 | 392 | 378 | 363 |
| At (° C.) | 407 | 422 | 412 | 390 |
| α ($×10^{-6}$/° C.) (100-300) | 12.2 | 12.2 | 12.3 | 12.9 |
| nd | 1.59973 | 1.61376 | 1.60938 | 1.589 |
| nF – nC | 0.00975 | 0.01037 | 0.01027 | 0.0099 |
| νd | 59.51 | 59.19 | 59.34 | 59.5 |
| Total of RO | 42 | 46 | 44 | 35 |

Further, Table 2 described below shows the evaluation results of samples 1 to 3 and the comparative sample as to whether or not the opacity occurs. The evaluation is conducted under different conditions, i.e., 60° C., Rh of 90% and 1000 hrs, and 85° C., Rh of 85% and 1000 hrs.

TABLE 2

| | Sample 1 | Sample 2 | Sample 3 | Comparative sample |
|---|---|---|---|---|
| 60° C. Rh90% 1000 hrs | No change (transparent) | No change (transparent) | No change (transparent) | No change (transparent) |
| 85° C. Rh85% 1000 hrs | No change (transparent) | No change (transparent) | No change (transparent) | Changed (white turbidity generated) |

As seen from Table 2, samples 1 to 3 have no opacity and are kept transparent.

In contrast, the comparative sample has the opacity under 85° C., Rh of 85% and 1000 hrs.

Accordingly, it is proved that, under 85° C., Rh of 85% and 1000 hrs, the glass sealing material 6 has no opacity in the composition range: 45 to 50 wt % of $P_2O_5$, 3 to 6 wt % of $Li_2O$, 0 to 3.5 wt % of MgO, 0 to 10 wt % of CaO, 0 to 15 wt % of SrO, 0 to 30 wt % of BaO, 15 to 35 wt % of ZnO, 0 to 1 wt % of $ZrO_2$, 38 to 49 wt % of RO, 0 to 1.5 wt % of $Nb_2O_5$ and 0 to 5 wt % of $Al_2O_3$.

Further, based on the studies of the inventors, it is confirmed that the $P_2O_5$—ZnO—$Li_2O$-based low-melting glass has preferable properties for the glass sealing material 6 in this embodiment when it is composed of: 45 to 50 wt % of $P_2O_5$, 3 to 6 wt % of $Li_2O$, 0 to 3.5 wt % of MgO, 0 to 10 wt % of CaO, 0 to 15 wt % of SrO, 0 to 30 wt % of BaO, 15 to 35 wt % of ZnO, 0 to 1 wt % of $ZrO_2$, 38 to 49 wt % of RO, 0 to 1.5 wt % of $Nb_2O_5$ and 0 to 5 wt % of $Al_2O_3$.

Meanwhile, with the above composition range, the glass sealing material 6 can have properties: Tg of 350 to 400° C.; At of 375 to 450° C.; α of 10.0 to $14.0 \times 10^{-6}$/° C.; nd of 1.58 to 1.62; and Abbe number vd of 59.0 to 64.0.

(Effects of the First Embodiment)

Effects obtained by the first embodiment are as follows:

(1) By using the glass sealing material 6 made of $P_2O_5$—ZnO—$Li_2O$-based low-melting glass and conducting the hot-pressing in a high viscosity state, the process can be conducted at a temperature sufficiently lower than the crystal growth temperature.

(2) A high sealing strength can be obtained since the glass-containing $Al_2O_3$ substrate 3 is bonded to the glass sealing material 6 based on the chemical bonding through the oxides. Thus, a compact package can be realized even when it has a small bonding area.

(3) Since the glass-containing $Al_2O_3$ substrate 3 has a thermal expansion coefficient similar to the glass sealing material 6, no adhesion failure such as separation and crack occurs therebetween even when they are brought into ordinary temperature or low temperature after being bonded at a high temperature.

Further, the glass is less likely to have a crack under compression stress although it is likely to have a crack under tensile stress. The glass sealing material 6 is adjusted to have a thermal expansion coefficient slightly smaller than the glass-containing $Al_2O_3$ substrate 3. It is confirmed by the inventors that no separation or crack occurs even in thousand cycles of liquid-phase cold-hot thermal shock tests between −40° C. and 100° C.

Further, it is confirmed that, when experiments are conducted such that a glass piece of 5 mm×5 mm is bonded to a ceramic substrate while altering the combination in thermal expansion coefficients between the glass piece and the ceramic substrate, no crack in bonding therebetween occurs if the ratio in thermal expansion coefficient of one material with a lower thermal expansion coefficient to the other material with a higher thermal expansion coefficient is 0.85 or more. Accordingly, although it depends on the rigidity or size of material, the similar thermal expansion coefficient means this range.

(4) Since no bonding wire is needed in the flip-chip bonding, no failure at electrode occurs even during the process in high viscosity state. Since the viscosity of the low-melting glass during the sealing process is as high as $10^8$ to $10^9$ poises, the property is significantly different from the epoxy resin that is in liquid state as low as 5 poises before the thermosetting process. Therefore, if a face-up type LED element where electrodes on the surface of the element are electrically connected through bonding wires to a power supplying member such as a lead is sealed with glass, the bonding wires may be crushed or deformed. However, in the flip-chip bonding, this problem can be avoided.

On the other hand, if a flip-chip type LED element is sealed with glass in which electrodes on the surface of the element are electrically connected through a bump of gold (Au) etc. to a power supplying member such as a lead, the crush of the bump or the short circuit between the bumps may be caused by a pressure applied to the LED element toward the power supplying member based on the high viscosity of glass. However, in this embodiment using the stud bump, this problem can be also avoided.

(5) By placing the low-melting glass in parallel with the glass-containing $Al_2O_3$ substrate 3 and then hot-pressing it in the high viscosity state, the occurrence of void can be prevented since the low-melting glass is moved in parallel on the surface of the glass-containing $Al_2O_3$ substrate 3 to be in close contact with it when sealing the GaN-based LED element 2.

(6) Since the wiring circuit pattern 4 formed on the glass-containing $Al_2O_3$ substrate 3 is drawn through the via-hole 3A to the bottom side, no means is needed for preventing the glass from invading unnecessary portion and for preventing the electrical terminals from being covered with the glass. Thus, by sealing in the lump the plural devices with the plate-like low-melting glass, the plural light emitting devices 1 can be easily mass-produced by cutting with the dicer.

Meanwhile, since the low-melting glass is processed in the high viscosity state, means needed in the resin sealing can be eliminated. Thus, if the external terminals are drawn to the bottom side, the plural light emitting devices 1 can be sufficiently mass-produced without using the via-holes 3A.

(7) Since the GaN-based LED element 2 is flip-chip mounted, the ultra-small light emitting device 1 as small as 0.5 mm square can be realized as well as overcoming the abovementioned problems in the glass sealing. This is because no space for the bonding wire is needed and the interface separation can be prevented even with so small bonding area due to the similarity in thermal expansion coefficient between the glass sealing material 6 and the glass-containing $Al_2O_3$ substrate 3 and the high bonding strength based on the chemical bonding therebetween.

(8) By adjusting the $P_2O_5$ content of the glass sealing material 6 to be 50% or less, it can have a stable moisture resistance even under a high humidity environment and the occurrence of white turbidity can be prevented.

(9) By adding $Li_2O$ to the glass sealing material 6, the improvement of weather resistance, the lower melting point and the enhanced stability of glass can be established.

Although in the first embodiment the GaN-based LED element 2 is used for the light emitting device 1, an LED element applicable to the glass sealing is not limited to the GaN-based LED element 2. It may be a semiconductor light emitting element composed of another semiconductor material.

Further, the light emitting device 1 can be fabricated as a wavelength conversion type that a phosphor is added to the $P_2O_5$—ZnO—$Li_2O$-based low-melting glass and the wavelength conversion is conducted by mixing excited light radiated from the phosphor with light emitted from the GaN-based LED element 2. Alternatively, a phosphor layer may be formed thin-film on the surface of the glass sealing material 6.

Second Embodiment

Figure 2A:
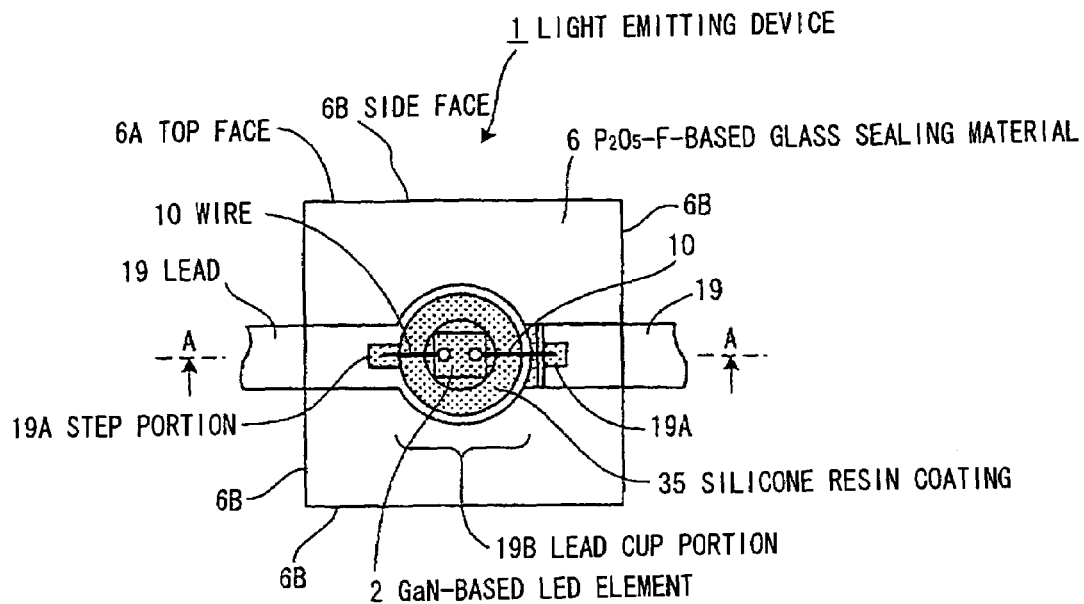
FIG. 2A is a top view showing a light emitting device as a solid-state optical device in a second preferred embodiment of the invention.
Figure 2B:
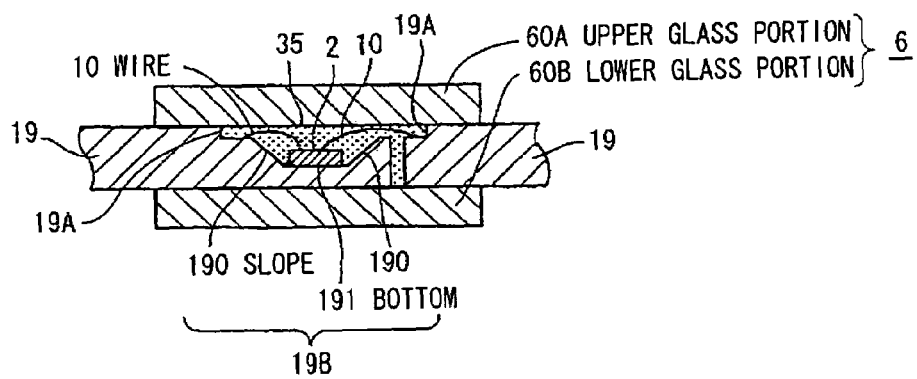
FIG. 2B is a cross sectional view cut along a line A-A in FIG. 2A.
Figure 2C:
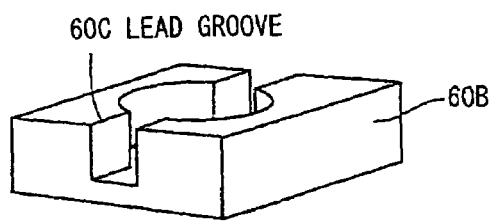
FIG. 2C is a perspective view showing a lower glass portion in FIG. 2B.

FIG. 2A is a top view showing a light emitting device as a solid-state optical device in the second preferred embodiment of the invention. FIG. 2B is a cross sectional view cut along a line A-A in FIG. 2A. FIG. 2C is a perspective view showing a lower glass portion in FIG. 2B.

(Construction of the Light Emitting Device 1)

The light emitting device 1 is composed of: a face-up type GaN-based LED element 2; a lead 19, as a power supplying/retrieving portion, with a lead cup portion 19B on which the GaN-based LED element 2 is mounted; wires 10 that electrically connects between the GaN-based LED element 2 and the lead 19; and a silicone resin coating 35 that covers the GaN-based LED element 2 and the wires 10 to protect them. The GaN-based LED element 2 and the lead 19 are integrally sealed with a $P_2O_5$—F-based glass sealing material 6 that is composed of preformed upper glass portion 60A and lower glass portion 60B.

The glass sealing material 6 has a composition in weight % based on oxide: 43 wt % of $P_2O_5$; 4.3 wt % of $Li_2O$; 18.9 wt % of $Na_2O$; 10.7 wt % of $K_2O$; 23.5 wt % of $Al_2O_3$; and 11 wt % of F, and properties: Tg of 326° C.; At of 354° C., $\alpha$:18.0×10$^{-6}$/° C., nd: 1.50, and vd: 69.8.

The lead cup portion 19B is formed cone-shaped with a slope 190 and a bottom 191, and is placed fitted into a lead groove 60C of the lower glass portion 60B as shown in FIG. 2C. The lead groove 60C is formed when the lower glass portion 60B is preformed by a mold (not shown).

(Process of Making the Light Emitting Device 1)

A process of making the light emitting device 1 will be described below.

At first, a lead frame (not shown) is prepared which is provided with a pair of copper leads 19 with silver plating formed on the surface thereof.

Then, the GaN-based LED element 2 is mounted on the lead cup portion 19B of the lead 19. The GaN-based LED element 2 is bonded onto the bottom 191 of the lead cup portion 19B through an inorganic transparent adhesive. Then, the pair of leads 19 and the GaN-based LED element 2 are electrically connected through the wires 10.

Then, the pair of leads 19 and the GaN-based LED element 2 electrically connected are placed in the lead groove 60C of the preformed lower glass portion 60B. Then, the silicone resin coating 35 is potted into the lead groove 60C to cover the pair of leads 19 and the GaN-based LED element 2.

Then, the upper glass portion 60A is integrated with the lower glass portion 60B by hot pressing. Then, the light emitting device 1 is cut off from the lead frame.

(Effects of the Second Embodiment)

Effects obtained by the second embodiment are as follows:

(1) Like the light emitting device of the first embodiment, by using the glass sealing material 6 made of the $P_2O_5$—F-based low-melting glass, the light emitting device 1 of the second embodiment can have a stable moisture resistance even at a high humidity environment and is less likely to have the white turbidity.

Further, due to the water-shedding effect of fluorine, it can endure with no change even at 85° C., Rh of 85% and 1000 hrs.

(2) Although the silicone resin may generate gas at about 400° C. due to the cutting of molecular bonding by heat, the process can be conducted at 360° C. where the silicone resin coating 35 is not thermally decomposed. Thus, heat in the glass sealing can be absorbed by the silicone resin and the thermal stress can be relaxed thereby.

(3) By using the preformed lower glass portion 60B in which the lead cup portion 19B is placed, the pair of leads 19 can be glass-sealed stably.

(4) By conducting the hot pressing onto the lead frame to seal separately the lead with glass and tie-bar cutting it from the lead frame, the light emitting device 1 can be produced in the lump to enhance the productivity.

(5) Since the pair of leads 19 made of soft metal such as copper are rich in elasticity as compared to the glass material, when its difference in thermal expansion coefficient from the GaN-based LED element 2 is in the range of 150% to 500%, stress based on the difference in thermal expansion coefficient can be absorbed while keeping the good bonding state with the glass material. Therefore, even when the pair of leads 19 are sealed sandwiched by the glass material, no failure such as crack does not occur.

Based on the studies of the inventors, it is confirmed that the $P_2O_5$—F-based low-melting glass has preferable properties for the glass sealing material 6 in this embodiment when it is composed of: 34 to 50 wt % of $P_2O_5$, 2 to 9 wt % of $Li_2O$, 7 to 28 wt % of $Na_2O$, 3 to 27 wt % of $K_2O$, where the total amount of $R_2O$ is 17 to 41 wt % (R: Li, Na, K), 6.5 to 30 wt % of $Al_2O_3$, and 1.5 to 32 wt % of F. Herein, $R_2O$ is a generic expression that includes $Li_2O$, $Na_2O$ and $K_2O$.

The above composition range allows properties: Tg of 230 to 350° C., At of 260 to 390° C., $\alpha$ of 15.0 to 28.0×10$^{-6}$/° C., and nd of 1.43 to 1.55. With the composition range, the glass sealing at about 400° C. or less as well as good moisture resistance can be effected. However, if only the moisture resistance is needed, the low-melting glass may have a composition, in weight % based on oxide, of 6 to 50 wt % of $P_2O_5$ and 1 to 45 wt % of F.

Alternatively, the $P_2O_5$—F-based low-melting glass may be composed of: 3.0 to 8.0 mol % of $P_2O_5$, 0.1 to 2.0 mol % of $Al_2O_3$, 1.0 to 7.0 mol % of BaO, 35.5 to 41.0 mol % of $AlF_3$, 8.0 to 13.0 mol % of $MgF_2$, 16.0 to 26.0 mol % of $CaF_2$, 15.0 to 21.0 mol % of $SrF_2$, 3.5 to 10.0 mol % of $BaF_2$, and 1.0 to 6.0 mol % of $NaF_2$.

Further, alternatively, the $P_2O_5$—F-based low-melting glass may be composed of: 15 to 32 wt % of $Al(PO_3)_2$, 0 to 10 wt % of $Ba(PO_3)_2$, 0 to 10 wt % of $Sr(PO_3)_2$, 0 to 10 wt % of $Ca(PO_3)_2$, 0 to 10 wt % of $Mg(PO_3)_2$, where the total amount of metaphosphates is 20 to 32 wt %, 20 to 70 wt % of $BaF_2$, 5 to 40 wt % of $SrF_2$, 0 to 15 wt % of $CaF_2$, 0 to 10 wt % of $MgF_2$, 0 to 5 wt % of $AlF_3$, 0 to 5 wt % of $GdF_3$, where the total amount of fluorides is 55 to 75 wt %, 5 to 22 wt % of $Gd_2O_3$, 0 to 7 wt % of $La_2O_3$, 0 to 10 wt % of $Y_2O_3$ and 0 to 10 wt % of $Yb_2O_3$, where the total amount of rare-earth salts is 5 to 22 wt %.

The invention is not limited to the above embodiments and may be variously modified within the scope of the invention. For example, the glass sealing material 6 may be provided with a surface treatment (=coating) for enhancing the moisture resistance, acid/alkali resistance formed on the surface. The surface treatment is preferably of $MgF_2$, $SiO_2$, SiN etc. Further, the surface treatment may be conducted to reduce the interface reflection by a reflection prevention multiplayer film etc. It is preferably a $TiO_2$+$SiO_2$ multiplayer coating.

Further, in the first embodiment, the glass sealing material 6 is provided with a semisphere or the like overmolded portion made of epoxy resin formed on the surface by transfer molding to further enhance the moisture resistance. The overmolded portion may be of another material, such as silicone resin, other than epoxy resin. It may be formed by another formation method, such as potting molding, other than the transfer molding.

The overmolded portion may be of the other resin materials such as acrylic rein and polycarbonate and formed by the injection method. In this case, the productivity can be enhanced.

Further, the overmolded portion may contain a phosphor. The phosphor may be YAG (yttrium aluminum garnet), silicate phosphors or a mixture thereof mixed in a given ratio.

Third Embodiment

Figure 3A:
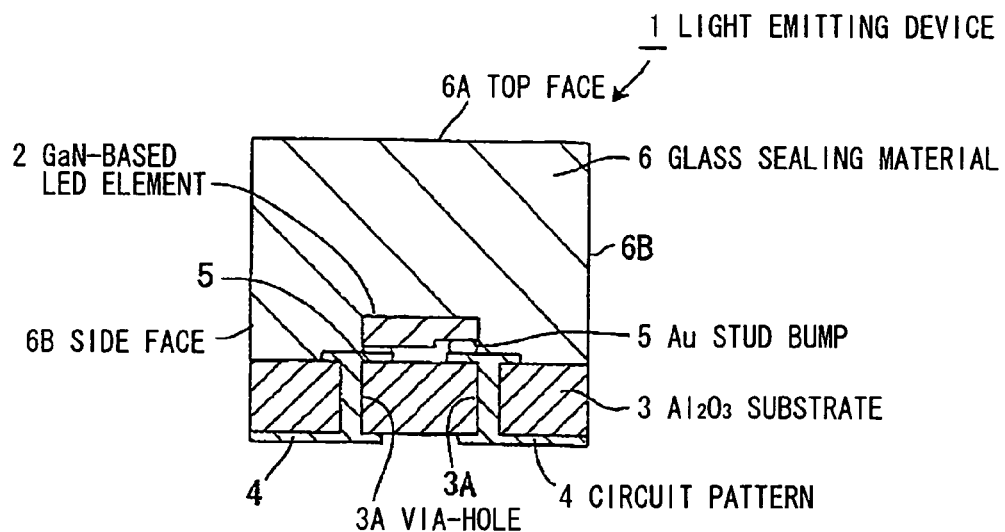
FIG. 3A is a cross sectional view showing a light emitting device as a solid-state optical device in a third preferred embodiment of the invention.
Figure 3B:
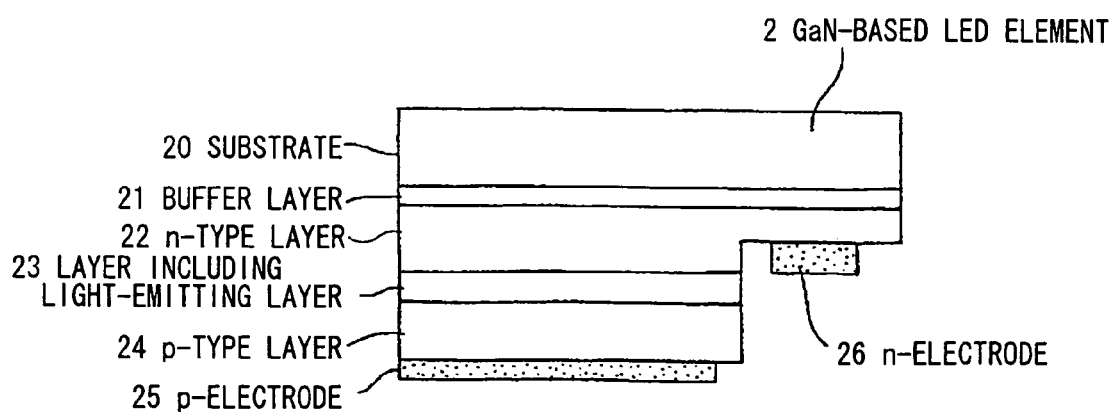
FIG. 3B is a side view showing a GaN-based LED element in FIG. 3A.

FIG. 3A is a cross sectional view showing a light emitting device as a solid-state optical device in the third preferred embodiment of the invention. FIG. 3B is a side view showing a GaN-based LED element in FIG. 3A.

(Construction of the Light Emitting Device 1)

The light emitting device 1 is, as shown in FIG. 3A, composed of: a flip-chip type GaN-based LED element 2 (with a thermal expansion coefficient α of 5 to $7\times10^{-6}$/° C.); an $Al_2O_3$ substrate 3, as an inorganic material substrate, on which the GaN-based LED element 2 is mounted; a circuit pattern 4 which is made of tungsten (W)-nickel (Ni)-gold (Au) and is formed on the $Al_2O_3$ substrate 3; Au stud bumps 5 which electrically connects between the GaN-based LED element 2 and the circuit pattern 4; and a glass sealing material 6 which is a transparent inorganic sealing material and is bonded to the $Al_2O_3$ substrate 3 while sealing the GaN-based LED element 2. In this embodiment, the $Al_2O_3$ substrate 3 and the circuit pattern 4 define a power supplying/retrieving portion.

The GaN-based LED element 2 is, as shown in FIG. 3B, composed of: a substrate 20 of sapphire ($Al_2O_3$); a buffer layer 21; an n-type layer 22; a layer 23 including a light-emitting layer; and a p-type layer 24, where the buffer layer 21 to the p-type layer 24 are sequentially grown on the substrate 20. Further, the GaN-based LED element 2 is composed of a p-electrode 25 formed on the p-type layer 24, and an n-electrode 26 formed on a part of the n-type layer 22 which is exposed by etching the p-type layer 24 through the n-type layer 22. The GaN-based LED element 2 is epitaxially grown at a temperature of 700° C. or more and has an allowable temperature limit of 600° C. or more, and it is stable to a process temperature in sealing with the low-melting glass described later.

The p-electrode 25 functions as a light reflecting layer to reflect light emitted from the layer 23 including the light-emitting layer toward the substrate 20. In this embodiment, the p-electrode 25 has dimensions of 0.34 mm wide×0.34 mm deep×0.09 mm thick.

The $Al_2O_3$ substrate 3 has a thermal expansion coefficient α of $7\times10^{-6}$/° C. and is provided with plural via-holes 3A. The via-holes 3A serves to electrically connect between the circuit patterns 4 metallized on the top and bottom surface of the substrate 3. The circuit pattern 4 is composed of a first conductive pattern formed on a side where the GaN-based LED element 2 is mounted, a second conductive pattern formed on the opposite side, and a third conductive pattern, which is of tungsten (W), to electrically connect the first and second conductive patterns.

The glass sealing material 6 is made of a $B_2O_3$—$SiO_2$—$Na_2O$—$ZnO$—$Nb_2O_5$-based low-melting glass. It is bonded to the $Al_2O_3$ substrate 3 by hot pressing with a mold and is formed rectangular with a top face 6A and a side face 6B made by cutting with a dicer.

The low-melting glass is typically processed with a viscosity several orders of magnitude higher than a high-viscosity level in resin. In the case of glass, in the range of practical sealing temperature, the viscosity thereof cannot be reduced to that of typical resin-sealing level even when it is heated to a temperature exceeding tens of ° C. over the yielding point. Nevertheless, in order to have the viscosity of typical resin-sealing level, it is needed to heat it to a temperature exceeding the crystal growth temperature of LED element. At such a high temperature, the glass will be adhered to the mold and, therefore, the sealing and molding therewith becomes difficult. Because of this, it is preferably processed at a viscosity of $10^4$ poises or more.

(Process of Making the Light Emitting Device 1)

A process of making the light emitting device 1 will be described below.

At first, the $Al_2O_3$ substrate 3 with the via-hole 3A is provided, and tungsten paste is screen-printed on the surface of the $Al_2O_3$ substrate 3 according to the circuit pattern 4.

Then, the $Al_2O_3$ substrate 3 with the tungsten paste printed thereon is thermally treated at 1000° C. or so to burn tungsten into the substrate 3, and nickel and gold are sequentially plated on tungsten to form the circuit pattern 4.

Then, the GaN-based LED element 2 is electrically bonded through the Au stud bumps 5 to the circuit pattern 4 (on the surface side) of the $Al_2O_3$ substrate 3.

Then, plate-like $B_2O_3$—$SiO_2$—$Na_2O$—$ZnO$—$Nb_2O_5$-based low-melting glass is placed in parallel with the $Al_2O_3$ substrate 3 with the GaN-based LED element 2 mounted thereon, and then hot-pressed in a nitrogen atmosphere. In the process, the viscosity of the low-melting glass is $10^8$ to $10^9$ poises and the low-melting glass is bonded to the $Al_2O_3$ substrate 3 through oxides included therein.

Then, the $Al_2O_3$ substrate 3 integrated with the low-melting glass is placed on the dicer and then is diced separately into the light emitting device 1.

(Composition of the Glass Sealing Material 6)

The low-melting glass applicable in this embodiment will be detailed below.

Samples 4 and 5 for the glass sealing material 6 are prepared by changing the composition of $B_2O_3$, $SiO_2$, $Al_2O_3$, $Li_2O$, $Na_2O$, $K_2O$, $MgO$, $CaO$, $SrO$, $BaO$, $ZnO$, $Nb_2O_5$, $ZrO_2$ and $TiO_2$. Table 3 described below shows the composition and properties of samples 4 and 5.

TABLE 3

| Composition (wt %) | Sample 4 | Sample 5 |
|---|---|---|
| $B_2O_3$ | 30 | 20 |
| $SiO_2$ | 5 | 10 |
| $Al_2O_3$ | | |
| $Li_2O$ | | |
| $Na_2O$ | 7 | 3 |
| $K_2O$ | | |
| $MgO$ | | |
| $CaO$ | | |
| $SrO$ | | |
| $BaO$ | | |
| $ZnO$ | 45 | 57 |
| $Nb_2O_5$ | 13 | 10 |
| $TiO_2$ | | |
| $ZrO_2$ | | |
| Tg (° C.) | 483 | 503 |
| At (° C.) | 517 | 534 |
| α ($\times10^{-6}$/° C.) (100-300) | 7.4 | 6.0 |
| nd | 1.68343 | |
| Total of essential components | 100 | 100 |

Sample 4 as shown in Table 3 has no opacity and is kept transparent as well as having properties: Tg of 483° C.; At of 517° C.; α of $7.4\times10^{-6}$/° C.; and nd of 1.68.

Sample 5 has excellent moisture resistance as well as having properties: Tg of 503° C.; At of 534° C.; and α of $6.0\times10^{-6}$/° C.

The composition of samples 4 and 5 allows a stable bonding strength to the $Al_2O_3$ substrate 3 with causing no separation or crack.

(Effects of the Third Embodiment)

Effects obtained by the third embodiment are as follows:

(1) By using the glass sealing material 6 made of $B_2O_3$—$SiO_2$—$Na_2O$—$ZnO$—$Nb_2O_5$-based low-melting glass and conducting the hot-pressing in a high viscosity state, the process can be conducted at a temperature sufficiently lower than the crystal growth temperature.

(2) A high sealing strength can be obtained since the $Al_2O_3$ substrate 3 is bonded to the glass sealing material 6 based on the chemical bonding through the oxides. Thus, a compact package can be realized even when it has a small bonding area.

(3) Since the $Al_2O_3$ substrate 3 has a thermal expansion coefficient similar to the glass sealing material 6, no adhesion failure such as separation and crack occurs therebetween even when they are brought into ordinary temperature or low temperature after being bonded at a high temperature.

Further, the glass is less likely to have a crack under compression stress although it is likely to have a crack under tensile stress. The glass sealing material 6 is adjusted to have a thermal expansion coefficient slightly smaller than the $Al_2O_3$ substrate 3.

In general, glass has a property that the thermal expansion coefficient increases at a temperature greater than Tg. Therefore, it is desired that, when glass-sealing at a temperature greater than Tg, the thermal expansion coefficient at the temperature greater than Tg is taken into account as well as a temperature lower than Tg to allow stability in the glass sealing. Namely, the glass material for the glass sealing material 6 is to have a thermal expansion coefficient equivalent to the $Al_2O_3$ substrate while considering its thermal expansion coefficients including one at the temperature lower than Tg and the thermal expansion coefficient of the $Al_2O_3$ substrate 3. Thereby, internal stress to cause the warping of the $Al_2O_3$ substrate 3 can be reduced, and the shear crack of glass can be avoided while securing the bonding strength between the $Al_2O_3$ substrate 3 and the glass sealing material 6. Thus, the size of the $Al_2O_3$ substrate 3 and the glass sealing material 6 can be increased to allow an increase in number of devices producible in the lump.

It is confirmed by the inventors that no separation or crack occurs even in thousand cycles of liquid-phase cold-hot thermal shock tests between −40° C. and 100° C.

Further, it is confirmed that, when experiments are conducted such that a glass piece of 5 mm×5 mm is bonded to a ceramic substrate while altering the combination in thermal expansion coefficients between the glass piece and the ceramic substrate, no crack in bonding therebetween occurs if the ratio in thermal expansion coefficient of one material with a lower thermal expansion coefficient to the other material with a higher thermal expansion coefficient is 0.85 or more. Accordingly, although it depends on the rigidity or size of material, the similar thermal expansion coefficient means this range.

(4) Since no bonding wire is needed in the flip-chip bonding, no failure at electrode occurs even during the process in high viscosity state. Since the viscosity of the low-melting glass during the sealing process is as high as $10^8$ to $10^9$ poises, the property is significantly different from the epoxy resin that is in liquid state as low as 5 poises before the thermosetting process. Therefore, if a face-up type LED element where electrodes on the surface of the element are electrically connected through bonding wires to a power supplying member such as a lead is sealed with glass, the bonding wires may be crushed or deformed. However, in the flip-chip bonding, this problem can be avoided.

On the other hand, if a flip-chip type LED element is sealed with glass in which electrodes on the surface of the element are electrically connected through a bump of gold (Au) etc. to a power supplying member such as a lead, the crush of the bump or the short circuit between the bumps may be caused by a pressure applied to the LED element toward the power supplying member based on the high viscosity of glass. However, in this embodiment using the stud bump, this problem can be also avoided.

(5) By placing the low-melting glass in parallel with the $Al_2O_3$ substrate 3 and then hot-pressing it in the high viscosity state, the occurrence of void can be prevented since the low-melting glass is moved in parallel on the surface of the glass-containing $Al_2O_3$ substrate 3 to be in close contact with it when sealing the GaN-based LED element 2.

(6) Since the wiring circuit pattern 4 formed on the glass-containing $Al_2O_3$ substrate 3 is drawn through the via-hole 3A to the bottom side, no means is needed for preventing the glass from invading unnecessary portion and for preventing the electrical terminals from being covered with the glass. Thus, by sealing in the lump the plural devices with the plate-like low-melting glass, the plural light emitting devices 1 can be easily mass-produced by cutting with the dicer.

Meanwhile, since the low-melting glass is processed in the high viscosity state, means needed in the resin sealing can be eliminated. Thus, if the external terminals are drawn to the bottom side, the plural light emitting devices 1 can be sufficiently mass-produced without using the via-holes 3A.

(7) Since the GaN-based LED element 2 is flip-chip mounted, the ultra-small light emitting device 1 as small as 0.5 mm square can be realized as well as overcoming the abovementioned problems in the glass sealing. This is because no space for the bonding wire is needed and the interface separation can be prevented even with so small bonding area due to the similarity in thermal expansion coefficient between the glass sealing material 6 and the $Al_2O_3$ substrate 3 and the high bonding strength based on the chemical bonding therebetween.

(8) Since the GaN-based LED element 2 has a thermal expansion coefficient equivalent to the glass sealing material 6, the thermal expansion coefficients of members including the $Al_2O_3$ substrate 3 are made to be equivalent. Therefore, internal stress can be kept very small even for a temperature difference between the high temperature and the ordinary temperature of the glass sealing. Thus, a stable processability can be obtained with having no crack. Further, since the internal stress can be kept small, a glass-sealed LED can be developed with an enhanced impact resistance and excellent reliability.

(9) The $Al_2O_3$ substrate 3 as an alumina substrate allows the cost reduction of components and is easily available. Thus, it enhances the mass producibility and the reduction in device cost. Further, since $Al_2O_3$ has excellent thermal conductivity, it can be easily applied to a high light intensity and high output type. Further, since $Al_2O_3$ has small light absorption, it is optically advantageous.

Meanwhile, it is confirmed that another composition of 25 wt % of $B_2O_3$, 2 wt % of $SiO_2$, 5 wt % of $Na_2O$, 50 wt % of ZnO, and 18 wt % of $Nb_2O_5$ is effective to allow At of 550° C. or less. In this case, nd is 1.73.

Based on the studies of the inventors, it is confirmed that the $B_2O_3$—$SiO_2$—$Na_2O$—$ZnO$—$Nb_2O_5$-based low-melting glass has preferable properties for the glass sealing material 6 in this embodiment when it is composed of: 19 to 30 wt % of $B_2O_3$, 0.5 to 15 wt % of $SiO_2$, 0 to 5 wt % of $Al_2O_3$, 0 to 3 wt % of $Li_2O$, 1.5 to 8 wt % of $Na_2O$, 0 to 4 wt % of $K_2O$, 0 to 5 wt % of MgO, 0 to 5 wt % of CaO, 0 to 5 wt % of SrO, 0 to 5 wt % of BaO, 44 to 60 wt % of ZnO, 9 to 19 wt % of $Nb_2O_5$, 0 to 4 wt % of $ZrO_2$ and 0 to 4 wt % of $TiO_2$.

Also, the inventors confirm that, when sample 6 with a composition shown in Table 4 described below is prepared and tested for moisture resistance, it has no optical failure such as white turbidity on the surface under 85° C., Rh of 85% and 2000 hrs.

TABLE 4

| Composition (wt %) | Sample 6 |
|---|---|
| $B_2O_3$ | 23 |
| $SiO_2$ | 13 |
| $Al_2O_3$ | |
| $Li_2O$ | 2 |
| $Na_2O$ | 3 |
| $K_2O$ | |
| MgO | |
| CaO | |
| SrO | |
| BaO | |
| ZnO | 47 |
| $Nb_2O_5$ | 11 |
| $TiO_2$ | |
| $ZrO_2$ | 1 |
| Tg (° C.) | 472 |
| At (° C.) | 500 |
| $\alpha$ (×$10^{-6}$/° C.) (100-300) | 7 |
| nd | 1.69227 |
| Total of essential components | 100 |

Sample 6 as shown in Table 4 has no opacity and is kept transparent as well as having properties: Tg of 472° C.; At of 500° C.; $\alpha$ of $7.0 \times 10^{-6}$/° C.; and nd of 1.69. The composition of sample 6 allows a stable bonding strength to the $Al_2O_3$ substrate 3 with causing no separation or crack as well as long-term excellent moisture resistance.

Although in the third embodiment the GaN-based LED element 2 is used for the light emitting device 1, an LED element applicable to the glass sealing is not limited to the GaN-based LED element 2. It may be a semiconductor light emitting element composed of another semiconductor material.

Meanwhile, the GaN-based LED element 2 can be processed by scribing. In this case, since the scribed GaN-based LED element 2 may have a sharp unevenness on the side face corresponding to the cut portion, it is desired that the side face of the GaN-based LED element 2 is coated with a device coat material. The device coat material can be, e.g., a $SiO_2$-based coat material with light transmitting property. The device coat material can prevent the occurrence of crack or void.

Further, the light emitting device 1 can be fabricated as a wavelength conversion type that a phosphor is added to the $B_2O_3$—$SiO_2$—$Na_2O$—ZnO—$Nb_2O_5$-based low-melting glass and the wavelength conversion is conducted by mixing excited light radiated from the phosphor with light emitted from the GaN-based LED element 2. Alternatively, a phosphor layer may be formed thin-film on the surface of the glass sealing material 6.

Fourth Embodiment

Figure 4A:
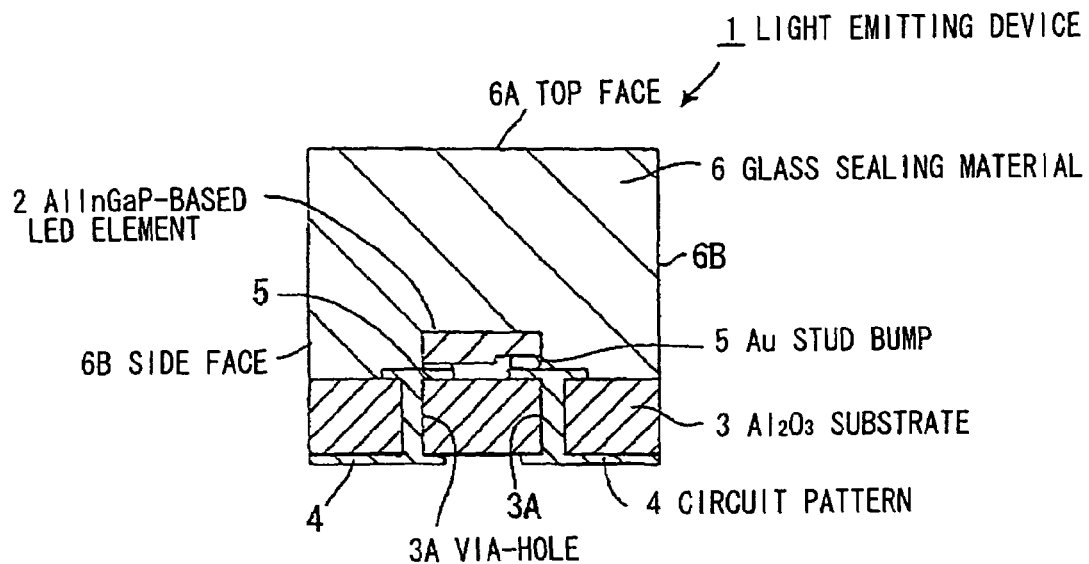
FIG. 4A is a cross sectional view showing a light emitting device as a solid-state optical device in a fourth preferred embodiment of the invention.
Figure 4B:
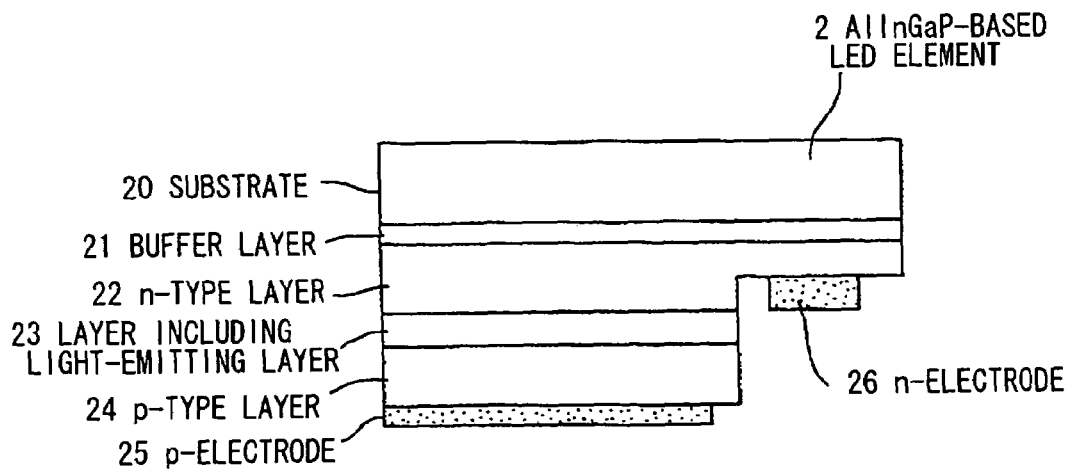
FIG. 4B is a side view showing an AlInGaP-based LED element in FIG. 4A.

FIG. 4A is a cross sectional view showing a light emitting device as a solid-state optical device in the fourth preferred embodiment of the invention. FIG. 4B is a side view showing an AlInGaP-based LED element in FIG. 4A.

The light emitting device 1 uses an LED element 2 made of AlInGaP-based semiconductor material as shown in FIG. 4A, and the AlInGaP-based semiconductor material is grown on the substrate (GaP substrate) 20 as shown in FIG. 4B.

The glass sealing material 6 is made of $B_2O_3$—$SiO_2$—ZnO—$Bi_2O_3$-based low-melting glass.

Meanwhile, like components with like functions are indicated below by the same numerals as used in the third embodiment.

(Composition of the Glass Sealing Material 6)

The $B_2O_3$—$SiO_2$—ZnO—$Bi_2O_3$-based low-melting glass applicable in this embodiment is detailed below.

Sample 7 for the glass sealing material 6 may be composed of $SiO_2$, $B_2O_3$, $La_2O_3$, $Gd_2O_3$, $Y_2O_3$, $ZrO_2$, $Nb_2O_5$, BaO, SrO, CaO, $TiO_2$, ZnO, $Bi_2O_3$, $Li_2O$, $Na_2O$ and $K_2O$. Table 5 described below shows the composition and properties of sample 7.

TABLE 5

| Composition (wt %) | Sample 7 |
|---|---|
| $SiO_2$ | 5 |
| $B_2O_3$ | 20 |
| $La_2O_3$ | |
| $Gd_2O_3$ | |
| $Y_2O_3$ | |
| $ZrO_2$ | |
| $Nb_2O_5$ | |
| BaO | |
| SrO | |
| CaO | |
| $TiO_2$ | |
| ZnO | 45 |
| $Bi_2O_3$ | 30 |
| $Li_2O$ | |
| $Na_2O$ | |
| $K_2O$ | |
| Tg (° C.) | 488 |
| At (° C.) | 519 |
| $\alpha$ (×$10^{-6}$/° C.) (100-300) | 6.2 |
| nd | 1.81016 |
| Total of essential components | 100 |

Sample 7 as shown in Table 5 has no opacity and is kept transparent as well as having properties: Tg of 488° C.; At of 519° C.; $\alpha$ of $6.2 \times 10^{-6}$/° C.; and nd of 1.81.

The composition of sample 7 allows a stable bonding strength to the $Al_2O_3$ substrate 3 with causing no separation or crack.

It is confirmed that another composition of 5 wt % of $SiO_2$, 20 wt % of $B_2O_3$, 10 wt % of $La_2O_3$, 35 to 45 wt % of ZnO, and 20 to 30 wt % of $Bi_2O_3$ is effective to allow At of 550° C. or less as well as nd of 1.77 or more.

Based on the studies of the inventors, it is confirmed that the $B_2O_3$—$SiO_2$—ZnO—$Bi_2O_3$-based low-melting glass has preferable properties for the glass sealing material 6 in this embodiment when it is composed of: 1 to 10 wt % of $SiO_2$, 15 to 30 wt % of $B_2O_3$, 0 to 20 wt % of $La_2O_3$, 0 to 20 wt % of $Gd_2O_3$, 0 to 10 wt % of $Y_2O_3$, 0 to 5 wt % of $ZrO_2$, 0 to 20 wt % of $Nb_2O_5$, 0 to 20 wt % of BaO, 0 to 20 wt % of SrO, 0 to 20 wt % of CaO, 0 to 20 wt % of $TiO_2$, 25 to 60 wt % of ZnO, 10 to 50 wt % of $Bi_2O_3$, 0 to 3 wt % of $Li_2O$, 0 to 3 wt % of $Na_2O$, and 0 to 3 wt % of $K_2O$.

Meanwhile, in this composition range, the glass sealing material 6 has properties: At of 550° C. or less, α of 6 to $8 \times 10^{-6}$/° C. and nd of 1.75 or more.

(Effects of the Fourth Embodiment)

In the light emitting device 1, the GaP substrate 20 with a high refractive index of n=3.5 and the AlInGaP-based LED element 2 with a refractive index equivalent thereto are sealed with the glass sealing material 6 made of the $B_2O_3$—$SiO_2$—ZnO—$Bi_2O_3$-based low-melting glass. Thereby, it can have excellent light extraction efficiency and good heat radiation property and mounting property.

Further, by using the high refractive index sealing glass, the aperture angle can be increased 30 to 40% in solid angle as compared to epoxy resin. According to this, the light extraction efficiency from LED element 2 can be enhanced.

Meanwhile, the substrate 20 may be made of a material other than GaP.

Fifth Embodiment

Figure 5:
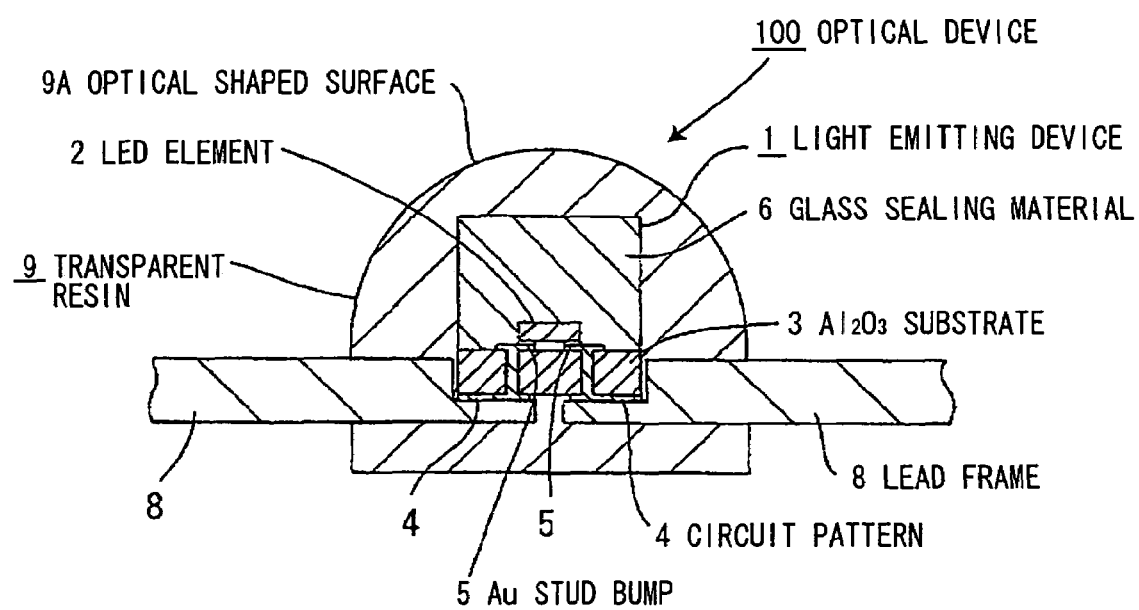
FIG. 5 is a cross sectional view showing a solid-state optical device in a fifth preferred embodiment of the invention.

FIG. 5 is a cross sectional view showing a solid-state optical device in the fifth preferred embodiment of the invention.

The optical device 100 is constructed such that the light emitting device 1 described in the third embodiment is bonded to a lead frame 8 and a transparent resin 9 made of transparent acrylic resin is formed thereon to cover the entire components except the lead frame 8.

The light emitting device 1 is formed by sealing the GaN-based LED element 2 with the glass sealing material 6 made of the $B_2O_3$—$SiO_2$—$Na_2O$—ZnO—$Nb_2O_5$-based low-melting glass.

The transparent resin 9 is provided with a semispherical optical shaped surface 9A, which has the LED element 2 as an origin, and is made by the injection method.

(Effects of the Fifth Embodiment)

Effects obtained by the fifth embodiment are as follows:

(1) The optical system with an arbitrary shape can be easily formed on the glass-sealed LED by using the resin material such as acrylic resin and polycarbonate and the injection method. Since the $Al_2O_3$ substrate 3 has such a mechanical strength that can endure a retention pressure in the injection molding or an external pressure applied by the resin injection, the transparent resin 9 with an arbitrary shape can be combined with the LED according to the use of the optical device 100. Further, since the LED element 2 is covered with the glass sealing material 6, the LED element 2 is less likely to be broken even when the injection rate of the resin material increases.

(2) By overmolding the glass-sealed light emitting device 1 with the resin material, the glass sealing material 6 can be protected from deteriorating as well as having a further enhanced moisture resistance.

(3) Since the transparent resin 9 is disposed through the glass sealing material 6 on the LED element 2, any resin materials can be used therefor even when it is not suitable for sealing directly the LED element 2 due to its light deterioration property. Thus, the freedom of designing can be enhanced. For example, the transparent resin 9 may be of a colored light-transmitting resin material.

(4) The light emitting device 1 has a rectangular shape that is easiest to form in mass production, and therefore it is such a low-cost compact package that the number of products acquired from one ceramic substrate can be maximized. Based on this, by sealing the periphery of the glass-sealed light emitting device 1 with the resin to form the optical shaped surface, light emitted from the light emitting device 1 can be externally radiated without being refracted at the interface of the light emitting device 1 and then the interface of the transparent resin 9. Namely, by seal the glass-sealed light emitting device with the resin material, the optical device 100 can be constructed easier and at lower cost than the case of forming the optical shaped surface using only the glass material.

Although, in the optical device 100, the resin material 9 is made of acrylic rein, it may be of another resin such as epoxy resin. Also, it may be formed by another formation method, such as potting molding, other than the transfer molding. The optical shaped surface may be another shaped surface other than the semi-spherical surface.

Further, the overmolded portion may contain a phosphor. The phosphor may be YAG (yttrium aluminum garnet), silicate phosphors or a mixture thereof mixed in a given ratio.

Sixth Embodiment

Figure 6A:
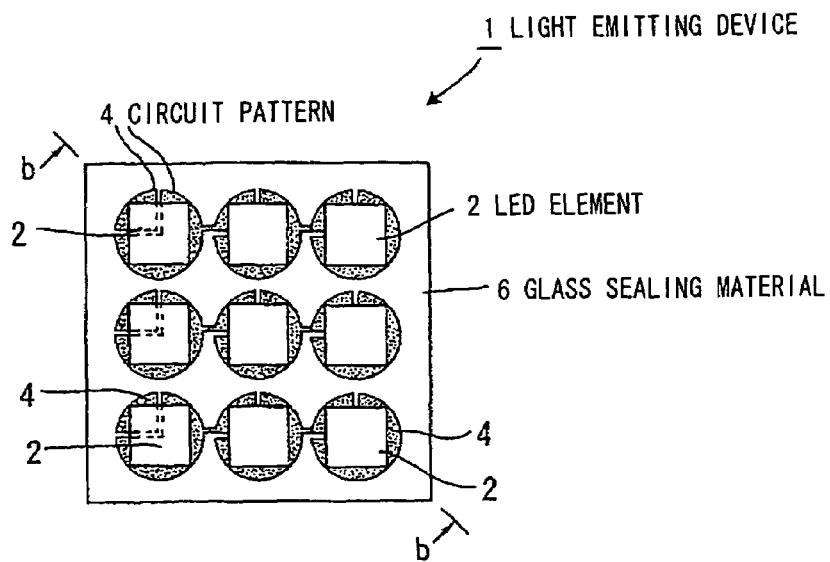
FIG. 6A is a top view showing a light emitting device as a solid-state optical device in a sixth preferred embodiment of the invention.
Figure 6B:
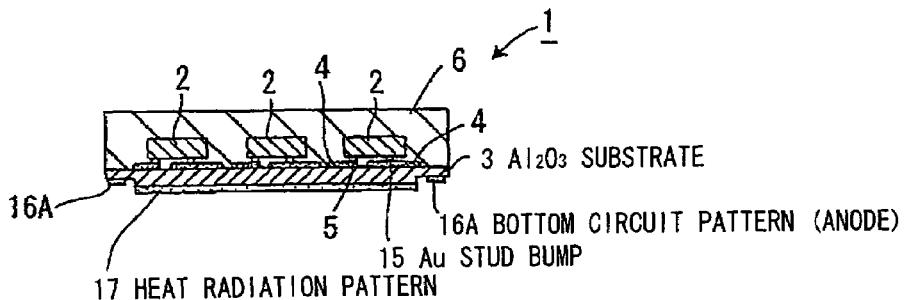
FIG. 6B is a cross sectional view cut along a line b-b in FIG. 6A.
Figure 6C:
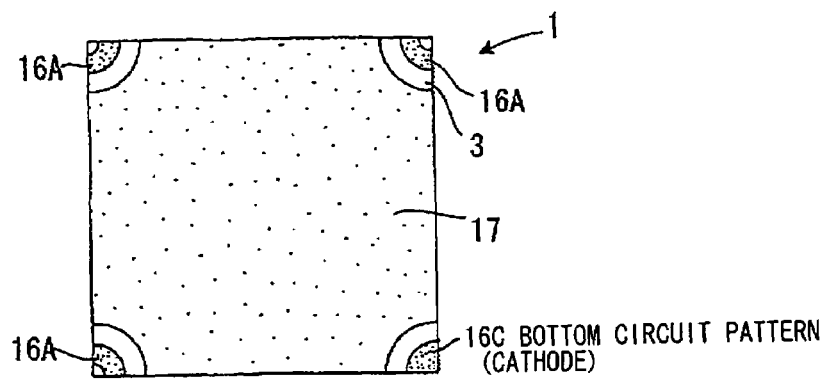
FIG. 6C is a bottom view showing the light emitting device in FIG. 6A.

FIG. 6A is a top view showing a light emitting device as a solid-state optical device in the sixth preferred embodiment of the invention. FIG. 6B is a cross sectional view cut along a line b-b in FIG. 6A. FIG. 6C is a bottom view showing the light emitting device in FIG. 6A.

(Construction of the Light Emitting Device 1)

The light emitting device 1 is, as shown in FIGS. 6A and 6B, composed of: nine flip-chip type GaN-based LED elements 2; a $Al_2O_3$ substrate 3, formed square in a multilayer structure, on which the GaN-based LED elements 2 are mounted; circuit patterns 4 which are made of tungsten (W) (the pattern on the substrate surface further provided with nickel (Ni) and gold (Au) plating formed thereon) and formed on the surface and inside of the $Al_2O_3$ substrate 3; Au stud bumps 5 which electrically connects between the GaN-based LED element 2 and the circuit pattern 4; a glass sealing material 6 which is made of $P_2O_5$—$Al_2O_3$—ZnO-based low-melting glass and is bonded to the $Al_2O_3$ substrate 3 while sealing the GaN-based LED element 2; bottom circuit patterns 16A (anodes) and 16C (cathode) that are exposed at four corners of the $Al_2O_3$ substrate 3 while being extended from the inside layer (intermediate layer); and a heat radiation pattern 17 which is made of copper for radiating externally heat generated from the LED element 2.

The nine LED elements 2 (with a chip size of 340 μm square) are in 3×3 arrangement close-mounted at intervals of 600 μm through the Au stud bump 5 on the separate circuit patterns 4 that are formed circular on the surface of the $Al_2O_3$ substrate 3.

The $Al_2O_3$ substrate 3 has the multilayer structure in which the inside wiring of tungsten (W) is formed. The three LED elements 2 in a row direction as shown in FIG. 6A are connected in series to form a element group, an anode for the element group is connected to one of the bottom circuit patterns 16A (anodes), and a cathode for the element group is connected to the bottom circuit pattern 16C (cathode). The bottom circuit pattern 16C (cathode) is also connected to the cathode for element groups in the other two rows.

(Composition of the Glass Sealing Material 6)

The low-melting glass applicable in the sixth embodiment will be detailed below.

Four samples 8 to 11 for the glass sealing material 6 are prepared by changing the composition of $P_2O_5$, $B_2O_3$, $Al_2O_3$, $Li_2O$, $Na_2O$, $K_2O$, MgO, CaO, SrO, BaO, ZnO, $Nb_2O_5$, $TiO_2$, $Bi_2O_3$, $Gd_2O_3$, $WO_3$, and $ZrO_2$. Table 6 described below shows the composition and properties of samples 8 to 11.

TABLE 6

| Composition (wt %) | Sample 8 | Sample 9 | Sample 10 | Sample 11 |
|---|---|---|---|---|
| $P_2O_5$ | 62 | 55 | 62 | 60 |
| $B_2O_3$ | | | | |
| $Al_2O_3$ | 9 | 7 | 11 | 9 |
| $Li_2O$ | | | | |
| $Na_2O$ | | | 2 | |
| $K_2O$ | | | 2 | |
| MgO | | | | |
| CaO | | | | |
| SrO | | | | |
| BaO | 4 | 3 | | 4 |
| ZnO | 25 | 35 | 21 | 27 |
| $Nb_2O_5$ | | | 1 | |
| $TiO_2$ | | | | |
| $WO_3$ | | | | |
| $ZrO_2$ | | | | |
| Tg (° C.) | 469 | 440 | 438 | 461 |
| At (° C.) | 517 | 475 | 487 | 506 |
| α (×$10^{-6}$/° C.) (100-300) | 6.8 | 6.4 | 7.7 | 6.6 |
| nd | 1.52714 | 1.5488 | 1.52919 | 1.52863 |
| vd | 64.1 | 61.1 | 61.9 | 63.2 |
| Total of essential components | 96 | 97 | 94 | 96 |

As seen from Table 6, all samples 8 to 11 have no opacity and are kept transparent as well as having a refractive index of 1.52 or more and a thermal expansion coefficient α nearly equivalent to the $Al_2O_3$ substrate 3.

The thermal expansion coefficients α in the variation range as shown in Table 6 allow a stable bonding strength to the $Al_2O_3$ substrate 3 with causing no separation or crack.

Based on the studies of the inventors, it is confirmed that the $P_2O_5$—$Al_2O_3$—ZnO-based low-melting glass has preferable properties for the glass sealing material 6 in this embodiment when it is composed of: 55 to 62 wt % of $P_2O_5$, 5 to 12 wt % of $Al_2O_3$, 20 to 40 wt % of ZnO, where $P_2O_5$+$Al_2O_3$+ZnO is 80 to 100 wt %, 0 to 5 wt % of $B_2O_3$, 0 to 3 wt % of $Li_2O$, 0 to 3 wt % of $Na_2O$, 0 to 3 wt % of $K_2O$, 0 to 5 wt % of MgO, 0 to 10 wt % of CaO, 0 to 10 wt % of SrO, 0 to 20 wt % of BaO, 0 to 20 wt % of $Nb_2O_5$, 0 to 20 wt % of $TiO_2$, 0 to 20 wt % of $Bi_2O_3$, 0 to 5 wt % of $Gd_2O_3$, 0 to 5 wt % of $WO_3$, and 0 to 5 wt % of $ZrO_2$.

In the composition range, the glass sealing material 6 can have properties: At of 550° C. or less, α of 6 to 8×$10^{-6}$/° C. and Abbe number vd of 61.1.

(Effects of the Sixth Embodiment)

Effects obtained by the sixth embodiment are as follows:

(1) Even when the plural LED elements 2 are close-mounted, the light emitting device 1 can have excellent reliability without causing crack since the LED element 2 has a thermal expansion coefficient α equivalent to the glass sealing material 6. Also, since the glass sealing material 6 has a thermal expansion coefficient α equivalent to the $Al_2O_3$ substrate 3, excellent glass bonding strength can be effected.

(2) By using the $Al_2O_3$ substrate 3, a stable heat radiation property can be obtained even when the GaN-based LED elements 2 with a large heat generation are close-mounted. Further, a series/parallel circuit can be easily patterned, and interconnection of wires can be easily designed in forming the electrolytic plating.

(3) By drawing out the external electrical connection terminals from the inside intermediate layer and disposing the metal heat radiation pattern 17 on the bottom, heat generated during the operation of the nine close-mounted LED elements 2 can be rapidly discharged from the heat radiation pattern 17 to a heat sink etc.

Meanwhile, the light emitting device 1 of the sixth embodiment can be also modified into the optical device 100 as shown in FIG. 5 by providing it with the transparent resin of a resin material. In this case, the $P_2O_5$—$Al_2O_3$—ZnO-based low-melting glass can have an enhanced moisture resistance.

Seventh Embodiment

Figure 7:
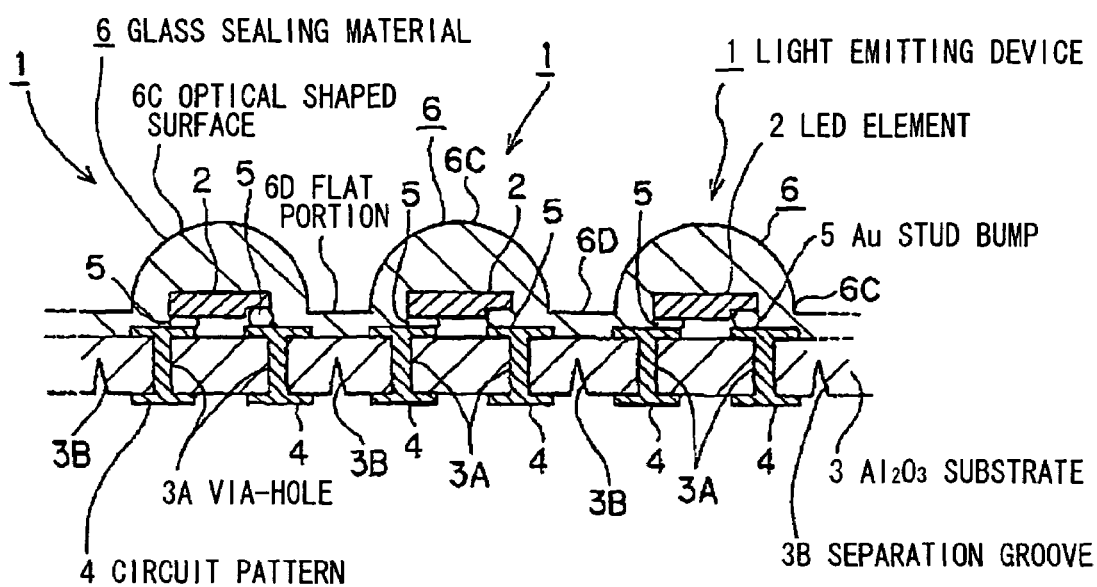
FIG. 7 is a cross sectional view showing a light emitting device as a solid-state optical device in a seventh preferred embodiment of the invention.

FIG. 7 is a cross sectional view showing a light emitting device as a solid-state optical device in the seventh preferred embodiment of the invention. In FIG. 7, there is shown a state that plural light emitting devices 1 are formed glass-sealed on the wafer-like $Al_2O_3$ substrate 3.

(Construction of the Light Emitting Device 1)

The light emitting device 1 is composed of: a flip-chip type LED element 2 which is made of GaN-based semiconductor; an $Al_2O_3$ substrate 3 on which the LED element 2 is mounted; a circuit pattern 4 which is formed on the $Al_2O_3$ substrate 3; Au stud bumps 5 which electrically connects between the LED element 2 and the circuit pattern 4; and a glass sealing material 6, with an optical shaped surface, which is made of $P_2O_5$—$Al_2O_3$—ZnO-based low-melting glass and is bonded in thermocompression to the $Al_2O_3$ substrate 3 while sealing the LED element 2. The $P_2O_5$—$Al_2O_3$—ZnO-based low-melting glass has the same composition as that of the sixth embodiment.

The $Al_2O_3$ substrate 3 is provided with a separation groove 3B, formed at given intervals, which corresponds to a substrate separation position in cutting off the devices after the glass sealing.

The glass sealing material 6 is bonded in thermocompression to the surface of the $Al_2O_3$ substrate 3 by hot-pressing a preformed glass which is in advance provided with the optical shaped surface 6C and a thin flat portion 6D by the performing process. The flat portion 6D has such a thickness that does not cause damage such as a crack to adjacent light emitting device 1 when cutting off the devices by applying a load to the scribing position.

The light emitting device 1 is produced such that the LED element 2 is mounted on the $Al_2O_3$ substrate 3 and sealed with the glass sealing material 6, and then, by applying the load to the substrate separation position 3B as the scribing position, the $Al_2O_3$ substrate 3 is cut off by the stress concentration as well as the glass sealing material 6 being cut off at the flat portion 6D.

(Effects of the Seventh Embodiment)

Effects obtained by the seventh embodiment are as follows:

(1) Since the LED element 2 is sealed with the glass sealing material 6 that has a thermal expansion coefficient equivalent to that of the $Al_2O_3$ substrate 3 used generally, internal stress due to heat generated during the processing can be reduced. Thereby, reliability in the glass sealing and mass productivity can be enhanced.

(2) Since the $Al_2O_3$ substrate 3 has a mechanical strength endurable for scribing, the narrower-pitch mounting can be performed as compared to the dicing which needs a cutting stock. Thus, the production yield can be increased.

For example, in the case of a small light emitting device 1 that a standard-size LED element 2 (with a chip size of 0.3 mm square) is glass-sealed at a pitch of 0.5 mm, if the glass sealing is conducted for the LED element 2 that is mounted at a pitch of 0.5 mm on a ceramic substrate without the cutting stock by using sealing glass and the ceramic substrate which have a thermal expansion coefficient of about $13\times10^{-6}/°$ C., crack will be caused by the difference in thermal expansion coefficient between the sealing glass and the LED element 2.

However, in this embodiment, since the glass sealing material 6 has a thermal expansion coefficient equivalent to the LED element 2 and the difference in thermal expansion coefficient between the glass sealing material 6 and the $Al_2O_3$ substrate 3 is small even when the bonding area therebetween is reduced, no crack or separation will be caused by the glass sealing or scribing in the glass sealing material 6 or between the glass sealing material 6 and the $Al_2O_3$ substrate 3.

(3) In dicing the light emitting device 1, residual strain may be generated in glass when cutting the wafer by a dicer and the glass sealing material 6 may have a defect by heat shock. However, when the light emitting device 1 is scribed, a failure such as a defect is less likely to be generated since the residual strain is reduced.

Instead of the scribing, the light emitting device 1 may be cut off by using laser light.

Eighth Embodiment

Figure 8:
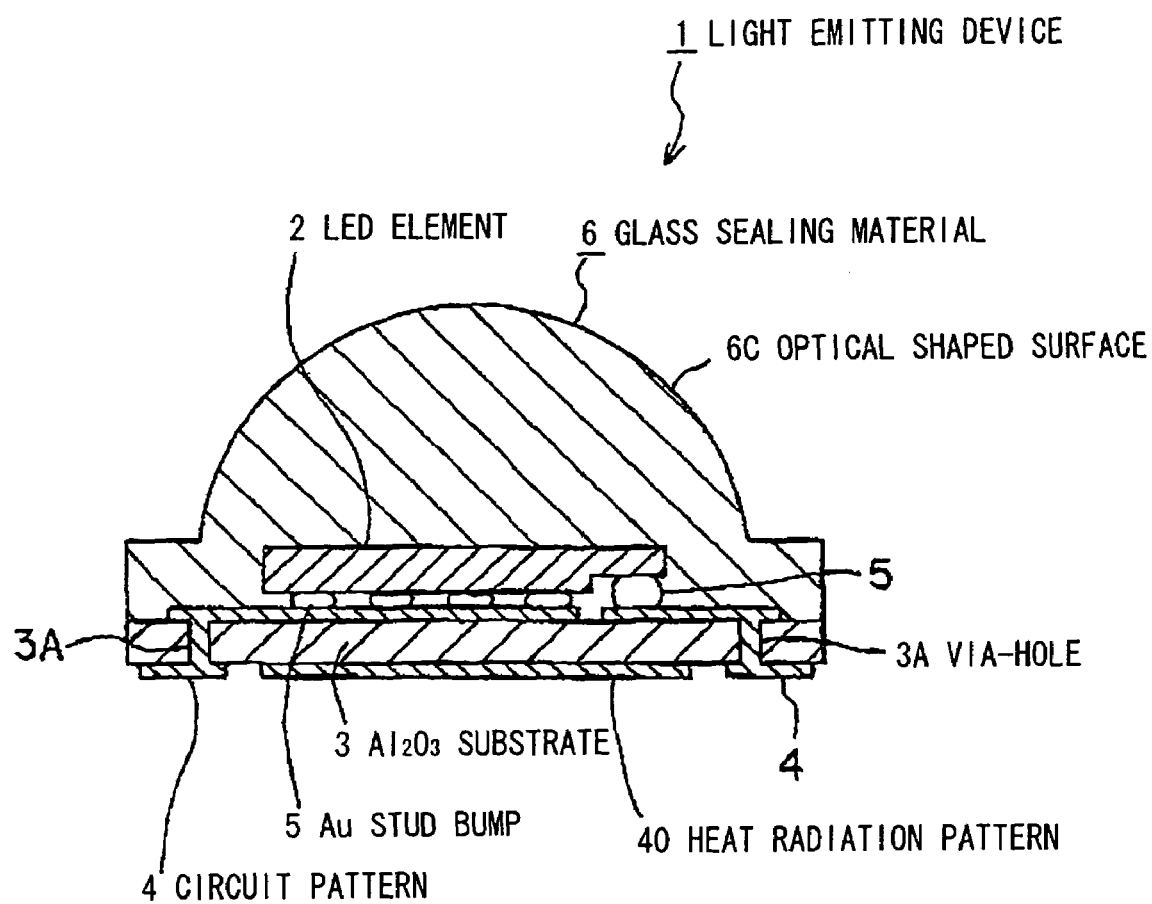
FIG. 8 is a cross sectional view showing a light emitting device as a solid-state optical device in an eighth preferred embodiment of the invention, wherein a large-size (1 mm square) LED element 2 is mounted.

FIG. 8 is a cross sectional view showing a light emitting device as a solid-state optical device in the eighth preferred embodiment of the invention, wherein a large-size (1 mm square) LED element 2 is mounted.

(Construction of the Light Emitting Device 1)

The light emitting device 1 is composed of: a flip-chip type large-size LED element 2 which is made of GaN-based semiconductor; an $Al_2O_3$ substrate 3 on which the LED element 2 is mounted; a circuit pattern 4 which is formed on the $Al_2O_3$ substrate 3; a heat radiation pattern 40, with a given surface area, which is made of a high thermal conductivity material such as copper foil and is disposed on the external connection side of the $Al_2O_3$ substrate 3; Au stud bumps 5 which electrically connects between the LED element 2 and the circuit pattern 4; and a glass sealing material 6, with an optical shaped surface, which is made of $B_2O_3$—$SiO_2$—PbO-based low-melting glass and is bonded in thermocompression to the $Al_2O_3$ substrate 3 while sealing the LED element 2.

(Composition of the Glass Sealing Material 6)

The $B_2O_3$—$SiO_2$—PbO-based low-melting glass for the glass sealing material 6 is composed of: 15 wt % of $SiO_2$, 13 wt % of $B_2O_3$; 56 wt % of PbO, 0.6 wt % of $As_2O_3$, 9 wt % of $Al_2O_3$, and 2 wt % of $La_2O_3$, and has properties: At of 550° C. or less, and α of $6.1\times10^{-6}/°$ C.

Since the $B_2O_3$—$SiO_2$—PbO-based low-melting glass has a thermal expansion coefficient α nearly equal to that of the $Al_2O_3$ substrate 3, it allows a stable bonding strength to the $Al_2O_3$ substrate 3 with causing no separation or crack.

Based on the studies of the inventors, it is confirmed that the $B_2O_3$—$SiO_2$—PbO-based low-melting glass has preferable properties for the glass sealing material 6 in this embodiment when it is composed of: 20 wt % to 50 wt % of $B_2O_3$ and 30 wt % to 70 wt % of PbO.

(Effects of the Eighth Embodiment)

In the eighth embodiment, no crack is caused by the difference in thermal expansion coefficient between the $Al_2O_3$ substrate 3 and the glass sealing material 6, and the light emitting device 1 with enhanced reliability can be thus obtained even when using the large-size LED element 2. In general, when returning to ordinary temperature from a stress-free state in glass sealing, stress is thereby caused in proportion to the size of the LED element 2. Since glass is a hard material as compared to resin, it is likely to have crack especially due to tensile stress or shear stress. However, it is confirmed by the inventors that the LED element 2 with a chip size of 1 mm square can be sealed with no crack by using the $Al_2O_3$ substrate 3 and the glass sealing material 6 in this embodiment.

Meanwhile, the light emitting device 1 of the eighth embodiment can be also modified into the optical device 100 as shown in FIG. 5 by providing it with the transparent resin of a resin material.

Ninth Embodiment

A light emitting device 1 is constructed such that, like the sixth embodiment, the nine large-size GaN-based LED elements 2 of the eighth embodiment are in 3×3 arrangement mounted on the $Al_2O_3$ substrate 3, and they are sealed with the glass sealing material 6 made of $B_2O_3$—$SiO_2$—PbO-based low-melting glass.

(Effects of the Ninth Embodiment)

In the ninth embodiment, the light emitting device 1 can have the same stable glass sealing property and excellent reliability as the eighth embodiment even when the plural large-size LED elements 2 are mounted.

Instead of the $Al_2O_3$ substrate 3 used in the ninth embodiment, a substrate with higher thermal conductivity may be used. For example, such a high conductivity substrate can be made of BeO (with a thermal expansion coefficient α of $7.6\times10^{-6}/°$ C. and a thermal conductivity of 250 W/(m·k)). The BeO substrate allows a good glass sealing property since it has a thermal expansion coefficient α equivalent to that of the glass sealing material 6.

The other substrate with high thermal conductivity may be a W—Cu substrate. For example, the W—Cu substrate is a W90-Cu10 substrate with a thermal expansion coefficient α of $6.5\times10^{-6}/°$ C. and a thermal conductivity of 180 W/(m·k), or a W85-Cu15 substrate with a thermal expansion coefficient α of $7.2\times10^{-6}/°$ C. and a thermal conductivity of 190 W/(m·k). These substrates allow high thermal conductivity as well as a good bonding strength to the glass sealing material 6. Thus, the light emitting device 1 can be easily applied to a high light intensity and high output type.

Although in the above embodiments the solid-state optical devices relate to the light emitting device using the LED element, the invention is not limited to the light emitting device. For example, the solid-state optical devices according to the invention can include another optical device or element such as a light receiving element and a solar cell element.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A solid-state optical device, comprising:
    a solid-state element;
    a power supplying/retrieving portion on which the solid-state element is mounted, the power supplying/retrieving portion supplying or retrieving electric power to/from the solid-state element; and
    a glass sealing material that seals the solid-state element,
    wherein the glass sealing material has a thermal expansion coefficient equivalent to that of the power supplying/retrieving portion, and
    wherein the glass sealing material comprises a $B_2O_3$—$SiO_2$—$Na_2O$—$ZnO$—$Nb_2O_5$-based low-melting glass that comprises 19 to 30 wt % of $B_2O_3$, 0.5 to 15 wt % of $SiO_2$, 1.5 to 8 wt % of $Na_2O$, 44 to 60 wt % of ZnO, and 9 to 19 wt % of $Nb_2O_5$ in weight %.

2. The solid-state optical device according to claim 1, wherein:

the low-melting glass further comprises 0 to 5 wt % of $Al_2O_3$, 0 to 3 wt % of $Li_2O$, 0 to 4 wt % of $K_2O$, 0 to 5 wt % of MgO, 0 to 5 wt % of CaO, 0 to 5 wt % of SrO, 0 to 5 wt % of BaO, 0 to 4 wt % of $ZrO_2$, and 0 to 4 wt % of $TiO_2$ in weight %.

3. The solid-state optical device according to claim 1, wherein:

the low-melting glass has a thermal expansion coefficient equivalent to that of the solid-state element.

4. The solid-state optical device according to claim 1, wherein:

the solid-state element is flip-chip mounted.

5. The solid-state optical device according to claim 1, wherein:

the power supplying/retrieving portion comprises an inorganic material substrate that comprises a conductive pattern to supply or retrieve electric power to/from the solid-state element, and the glass sealing material has a thermal expansion coefficient equivalent to that of the inorganic material substrate.

6. The solid-state optical device according to claim 1, wherein:

the glass sealing material comprises a coating, which effects a moisture resistance and acid/alkali resistance, formed on a surface thereof.

7. The solid-state optical device according to claim 1, wherein:

the solid-state element comprises an optical element, and the glass sealing material comprises a light-transmitting material.

8. The solid-state optical device according to claim 1, wherein:

the glass sealing material is over molded with a resin.

* * * * *